US 6,570,539 B1

(12) United States Patent
Snow et al.

(10) Patent No.: US 6,570,539 B1
(45) Date of Patent: May 27, 2003

(54) METHOD FOR VIBRATION DETECTION DURING NEAR-FIELD ANTENNA TESTING

(75) Inventors: Jeffrey M. Snow, Bloomington, IN (US); William Slowey, Bloomington, IN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/028,969

(22) Filed: Dec. 27, 2001

(51) Int. Cl.$^7$ .............................................. G01R 29/10
(52) U.S. Cl. ...................... 343/703; 455/67.1; 342/165
(58) Field of Search ......................... 343/703; 324/318, 324/58.5, 95, 106; 455/67.1

(56) References Cited

U.S. PATENT DOCUMENTS

| | | | | |
|---|---|---|---|---|
| 3,562,642 A | * | 2/1971 | Hochschild | 324/58.5 |
| 5,311,440 A | | 5/1994 | Hess, Jr. | 364/481 |
| 5,365,241 A | | 11/1994 | Williams et al. | 343/703 |
| 5,408,318 A | | 4/1995 | Slater | 356/351 |
| 5,419,631 A | | 5/1995 | Slater | 356/355 |
| 5,485,158 A | | 1/1996 | Mailloux et al. | 342/165 |
| 5,881,470 A | | 3/1999 | Hindman et al. | 33/503 |
| 6,188,220 B1 | | 2/2001 | Schaefer | 324/318 |

* cited by examiner

Primary Examiner—James Clinger
(74) Attorney, Agent, or Firm—Mark Homer

(57) ABSTRACT

Disclosed herein is a method of detecting relative vibration between an AUT and a probe during any type of near-field testing. The method also provides the means to measure and compensate for any data inaccuracies/errors created by relative vibration while requiring no additional hardware other than that normally utilized in conducting a near-field test.

In contrast to the standard process of collecting data only at a series of discrete points, data is collected regularly as the probe moves with a constant velocity across its measurement plane or virtual surface. Due to the constant collection of data, each principle data point is accompanied by a series of leading and trailing secondary data points. While the principle data points are, as in a standard near-field test, transformed by a computer to determine the AUT's far-field pattern (or to identify malfunctioning antenna elements), analysis of the secondary data points reveals any relative vibration between the AUT and the probe.

This method eliminates a source of test error and increases the confidence that an accurate test has been conducted. The vibration information provided by this method may be used to actively compensate (in analysis or hardware) for any principle data point position inaccuracy/error caused by the vibration.

18 Claims, 4 Drawing Sheets

METHOD FOR VIBRATION DETECTION DURING NEAR-FIELD ANTENNA TESTING

STATEMENT OF GOVERNMENT INTEREST

The invention described herein may be manufactured and used by or for the Government of the United States of America for governmental purposes without payment of any royalties thereon or therefor.

BACKGROUND OF THE INVENTION

1. Field of the Invention

The present invention relates to the measurement of the radiation characteristics of radio frequency (RF) antennas, and more particularly to a near-field measurement method which, while measuring the radiating near-field of an antenna under test (AUT), detects relative vibration between an AUT and a near-field measurement probe.

2. Description of the Background

High performance antennas are becoming increasingly prevalent as spacecraft, aircraft, ship, and ground vehicle mission requirements become more sophisticated. One problem in the development and manufacture of high performance antennas is the accurate measurement of antenna performance. Traditionally, antenna performance measurement was conducted by placing the antenna at a remote location, and measuring the amplitude response characteristics as a function of orientation of the antenna throughout its operational range. Required measurement distances for high gain antennas range from fifty feet to three miles or more. This measurement technique, known as far-field testing, suffers from significant practical limitations, such as susceptibility to the effects of weather, ground reflections, and increasing real estate costs.

As an alternative to far-field testing, near-field testing was developed. Near-field testing is conducted to determine an antenna's performance or pattern, or to locate defective elements on the antenna. A near-field test consists of accurately passing a probe across the face, or a virtual surface, of an antenna. A typical near-field measurement system consists of three primary subsystems; a computer, a robotic positioner, and a probe. The computer provides the user interface and controls the operation of the probe. In addition it commands the robotic positioner which moves the antenna under test (AUT), the probe, or both over the desired virtual surface. However, relative vibration between the AUT and the near-field test probe causes inaccuracies/errors in the data collected.

Generally, in a near-field test, the probe is used to emit an RF signal that the AUT receives. The near-field testing equipment records the amplitude and phase of the RF signal received for a series of discrete data point across a virtual surface of the AUT. Typical testing protocol requires that the discrete data points be no farther apart than one-half the length of the RF signal's wavelength. The discrete data points are usually collected along a plane located two to five wavelengths in front of the AUT, or along the surface of a cylinder or sphere that encloses the AUT. The system may also be operated in reverse with the AUT emitting and the probe receiving a series of RF signals. The computer is then utilized to transform the amplitude and phase at each discrete data point into a far-field pattern representing that for the AUT. The computer may also transform the data into the amplitude and phase at the face of the AUT (it is not possible to use a probe this close to the antenna—its presence affects the electric field to a degree that renders meaningless any data that is collected). By comparison with expected data, malfunctioning antenna elements are clearly identified.

Knowing the precise locations of the probe and the AUT when a discrete amplitude/phase data point is recorded is the most critical element of a near-field test. Relative movement (e.g. vibration) between the probe and the AUT may introduce inaccuracies/errors into the process. Typically, if displacement due to relative vibration exceeds 1/100 of the RF wavelength, accuracy of the near-field test will be reduced. Therefore, in order to minimize relative movement/vibration, near-field testing typically has been conducted in an indoor test facility utilizing fixed, rigid equipment with the AUT mounted on a stable, rigid fixture. However, this form of testing requires the presence of the antenna at the test facility. Depending on the location of the antenna to be tested, the cost of its transportation to and from the test facility, and the opportunity cost while the antenna is out of service, the indoor testing process is not always a cost-effective means of evaluating an antenna.

In response to the foregoing concerns, an array of portable testing equipment has been developed. However, the nature of on-site (i.e. outside of a test facility) testing using portable testing equipment generates a greater degree of inaccuracy/error in the measurement of the position of the probe and/or the AUT due to relative vibration. By its very nature portable near-field equipment cannot be as heavy and/or rigid as fixed, laboratory equipment. Consequently, the probe and the portable structure supporting/moving the probe are more likely to vibrate due to the surrounding environment (e.g. nearby ground vehicle vibrations, wind, inadvertent bumping of the portable structure). Similar forces may also cause the AUT to vibrate when it is mounted on a transportation device (e.g. a truck, a trailer, an aircraft) rather than a rigid test fixture. Any relative vibration between the probe and the AUT caused by the surrounding environment will cause test inaccuracies/errors. It is extremely rare where there is no relative vibration, or the probe and the AUT vibrate with exactly the same frequency, phase, and amplitude. In all other cases, and in all practicality, data inaccuracies/errors are introduced.

There have been attempts to solve data inaccuracies/errors due to other factors. For example, U.S. Pat. No. 5,419,631 to Slater discloses an apparatus and method to compensate for position inaccuracies/errors introduced by the thermal expansion/contraction of the probe and the AUT. However, there are no known methods for use in detecting relative vibration between a probe and AUT during near-field testing which do not require additional equipment.

SUMMARY OF THE INVENTION

It is, therefore, the primary object of the present invention to provide a method to detect relative vibration between a-probe and an AUT during near-field testing.

It is another object to measure and compensate for data inaccuracies/errors generated by relative vibration between a probe and an AUT during near-field testing.

It is still another object to provide a method to detect relative vibration between a probe and an AUT during near-field testing, and measure/compensate for the data inaccuracies/errors generated thereby, that is economical and does not require any equipment beyond that normally utilized for a near-field test.

In accordance with the above objects, the present invention is a method of detecting relative vibration between an AUT and a probe during any type of near-field testing. The method also provides the means to measure and compensate for any data inaccuracies/errors created by relative vibration while requiring no additional equipment, or hardware, other than that normally utilized in conducting a near-field test.

The present invention introduces a change in the data collection process during a near-field test. In contrast to the standard process of collecting data only at a series of discrete points, data is sampled regularly as the probe moves with a constant velocity across its data plane/measurement field or virtual surface. In accordance with the present method of data sampling constant, each principle data point (the series of points typically separated by typically no more than one-half the length of the RF signal's wavelength) is sampled along with a series of leading and trailing "secondary" data points. The phase at each secondary data point needs to be recorded. While the principle data points are, as in a standard near-field test, transformed by a computer to determine the AUT's far-field pattern (or to identify malfunctioning antenna elements), analysis of the phase variation in the secondary data points reveals any relative vibration between the AUT and the probe.

At each secondary data point, the phase is measured for a constant frequency and beam position. The phase of a single frequency RF signal is recorded at each secondary data point. Any relative movement between the probe and the AUT causes the phase to change. Relative vibration between the probe and the AUT causes the phase to vary with a frequency equal to that of the relative vibration. The near-field equipment computer then performs a Fourier transform of the time varying phase to the frequency domain. This transform causes the vibration frequency to show up as spikes in a frequency domain plot.

The implementation of this method results in the detection of relative vibration between the RF probe and the AUT. It is a method that is superior to others involving additional hardware. Vibration sensors attached to the probe and/or the AUT may easily fail to detect the full amount of vibration. For example, a vibration sensor attached to a single point on the AUT may not provide an accurate measure of the vibration that is occurring in the AUT directly opposite the probe (this is especially true for large antennas).

This method eliminates a source of test error and increases the confidence that an accurate test has been conducted. The vibration information provided by this method may be used to actively compensate (in analysis or hardware) for any principle data point position inaccuracy/error caused by the vibration.

BRIEF DESCRIPTION OF THE DRAWINGS

Other objects, features, and advantages of the present invention will become more apparent from the following detailed description of the preferred embodiments and certain modifications thereof when taken together with the accompanying drawings in which:

FIG. 3 illustrates phase measurements at 128 secondary data points when there is no vibration (just phase noise).

FIG. 4 illustrates the frequency spectrum for the data shown in FIG. 3.

FIG. 5 illustrates a series of phase measurements at 128 secondary data points with a 5 hertz vibration frequency added.

FIG. 6 illustrates the frequency spectrum for the data shown in FIG. 5.

DETAILED DESCRIPTION OF THE PREFERRED EMBODIMENTS

Figure 1:
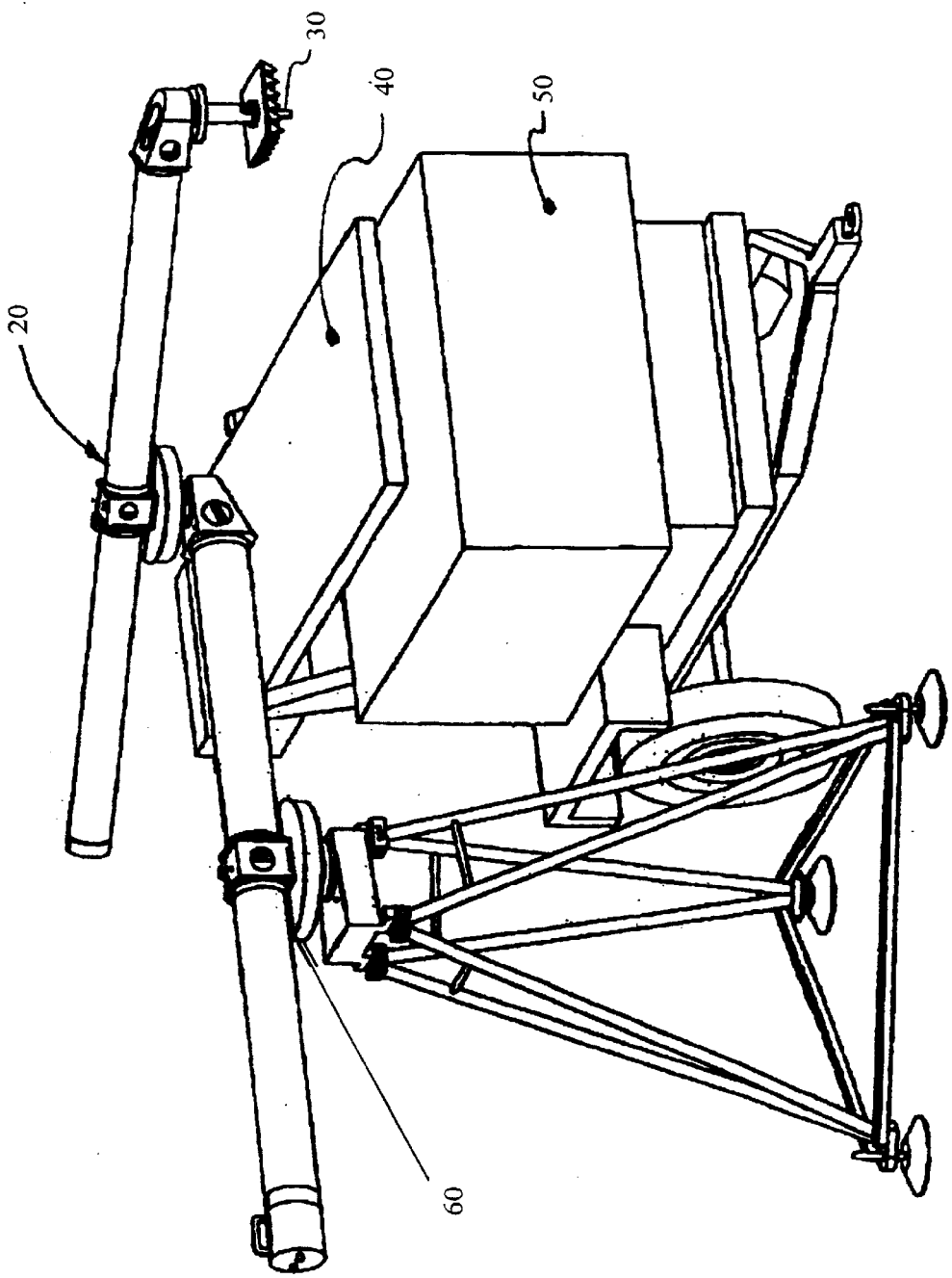
FIG. 1 is an isometric view of an exemplary on-site, near-field testing arrangement including a near-field scanner 20, a test probe 30, an antenna under test (AUT) 40, a mounting/transportation apparatus 50 for the AUT, and a computer 60.

FIG. 1 is an isometric view illustrating an exemplary arrangement of equipment for conducting an on-site near-field test in accordance with the method of the present invention. The equipment includes a portable near-field scanner 20 that supports and controls the movement of a test probe 30) for near-field testing of an antenna under test (AUT) 40. A conventional scanner 20 preferably possesses the ability to move the probe 30 along any of two independent axes of motion. The probe 30 is generally of a conventional type that can either emit or receive/detect RF signals (i.e. while a typical near-field test involves the emission of RF signals by the probe 30 which are received/detected by the AUT 40, testing may also be conducted with the AUT 40 emitting and the probe 30 receiving/detecting the RF signals). The AUT 40 is preferably tested while still mounted on its normal transportation apparatus 50. The normal transportation apparatus is typically a trailer, ship, aircraft, etc. The computer 60 may be any conventional computer having existing hardware and programming as necessary to control the operation of the scanner 20 (i.e. the movement of the probe 30), to retain and organize the data collected, and to perform the required Fourier transforms. Computer 60 also provides a suitable operator interface including visual display and keyboard entry. An exemplary scanner 20 is the space probe antenna calibration system (SPACS). SPACS is an existing portable near-field testing system used to test the antenna of the AN/TPS-59 radar. The antenna size is roughly 30 feet by 16 feet. Testing is accomplished with the AN/TPS-59 assembled outside in its normal fielded configuration.

Figure 2:
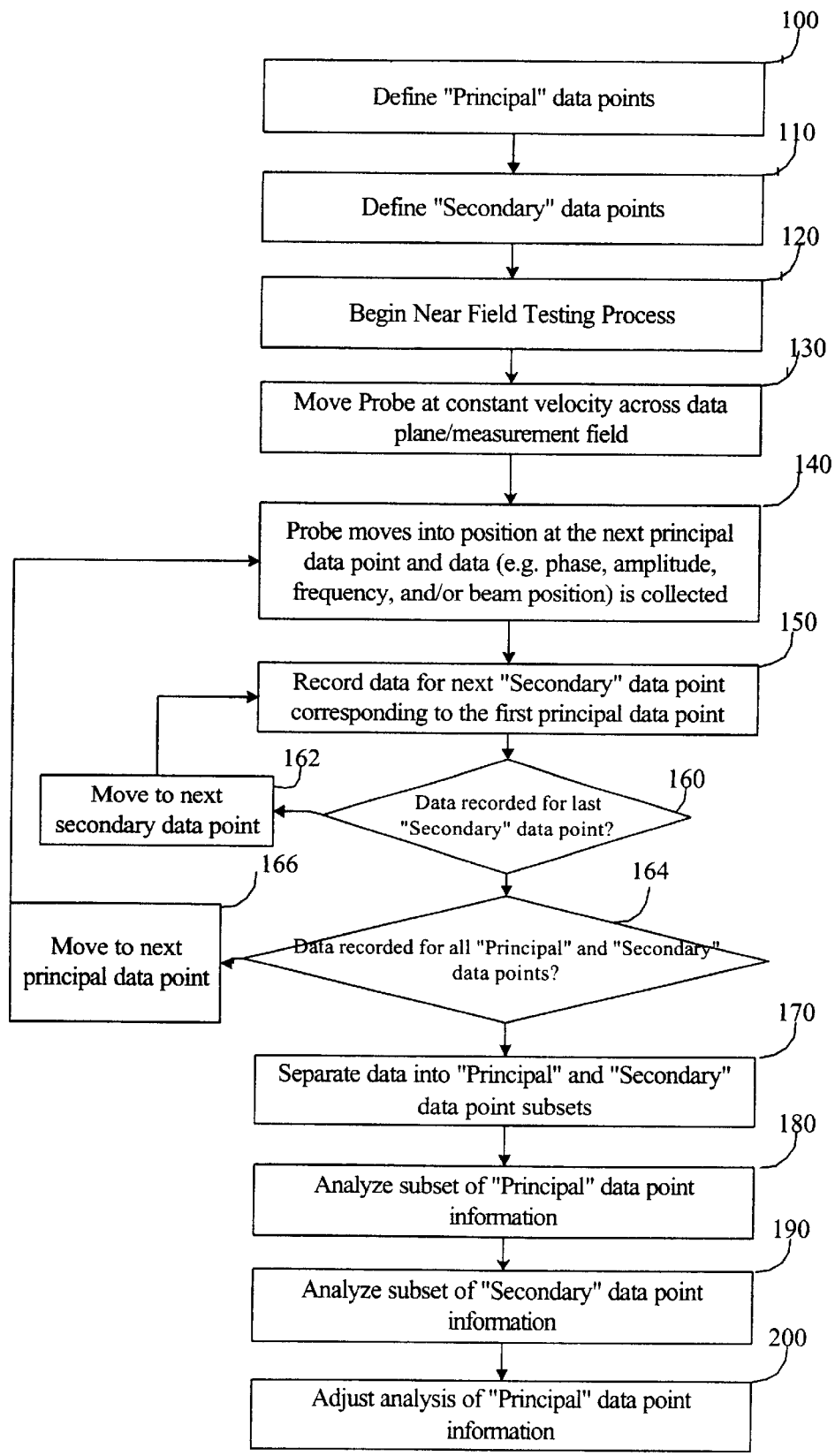
FIG. 2 is a flow chart representation of the method for detecting relative vibration between a probe and an AUT during near-field testing according to a first embodiment of the present invention.

FIG. 2 is a flow chart representation of the method of near-field measurement which detects relative vibration between AUT 40 and a near-field measurement probe 30 while measuring the radiating near-field of the AUT 40 according to a first embodiment of the present invention. The method of FIG. 2 may be employed with the equipment described above in regard to FIG. 1.

With reference to FIG. 2, at Step 100, "principal" data points are defined and are entered into computer 60. The principal data points (in a planar near-field test) are a series of discrete points along a plane located two to five wavelengths in front of the AUT 40, or along the surface of a virtual cylinder or sphere that encloses the AUT 40. In a planar near-field test, the principal data points are typically separated by no more than one-half the length of the target RF signal's wavelength. These "principal" data points constitute all of the positions of interest at which data is collected, during a conventional near-field test.

At Step 110, a series of "secondary" data points are defined. The secondary data points may be defined independent of the foregoing principle data points (such as, for example, when the probe is stationary). Normally, secondary data point sets are defined relative to principal data points such as, for example, secondary data points occurring between two adjoining principle data points, or secondary data point sets that are between or around one or more principle data points sets (between or around defined previously in Step 100). The secondary data points are either entered into computer 60 or are automatically calculated thereby. Each series of "secondary" data points roughly corresponds to a principal data point. Each series of "secondary" data points includes leading, intermediate, and trailing points surrounding a principal data point. These "secondary" data points form the basis of the improvement in near-field testing provided by the present invention.

The spacing and duration of a set of secondary data points is determined with regard to the highest and lowest vibration frequencies of concern. These frequencies are determined by experience, test, and/or some analysis of possible vibration modes and frequencies. Generally, Secondary data points must be taken at a minimum of least twice the highest frequency that is to be detected. A set of secondary data points must be taken over at least one time period or cycle of the lowest frequency that is to be detected. For example, if ½ hertz (cycle per second) is the lowest frequency of concern, then secondary data points must be taken over two seconds. It is noteworthy that this may require using secondary data points that are spread over one or more principle data points. This also may cause irregular spacing between secondary data points. Data points with irregular spacing can be analyzed for vibration with a Fourier transform, however, more computation effort is required than data points with regular spacing and there may some degradation of the accuracy of the Fourier transform. On the other hand, using secondary data point sets that span one or more principle data points allow quicker test times.

At Step 120, the near-field testing sequence begins, using an arrangement of equipment such as that shown and described with reference to FIG. 1. A typical near-field test involves the coordinated emission of a series of pre-determined radio frequencies by the probe 30 and their detection/measurement by the AUT 40.

At Step 130, the probe 30 is moved at a constant velocity across the measurement field/data plane of the AUT 40 (scanner 20 moves the probe 30 along any of the two axes of motion). A constant velocity is maintained to avoid intermittent motion (i.e. starting and stopping) of the probe 30. Intermittent probe 30 motion introduces the need for settling time prior to the recording of measurements (e.g. phase, amplitude, frequency, and/or-beam position for AUTs with electronically-steered beams) at each data point and thereby greatly lengthens the time required to complete the test.

At Step 140, the probe 30 is moved through position at the first principal data point and data (e.g. phase, amplitude, frequency, and/or beam position) is collected.

At Step 150, the phase and amplitude for different, pre-determined combinations of radio frequency and beam position of interest (for AUTs with electronically-steered beams) are recorded for each "secondary" data point corresponding to the initial principal data point of Step 140, beginning with the leading secondary point, spanning all intermediate secondary points, and ending at the trailing secondary point.

At Step 160, a determination is made as to whether the secondary data point just measured is a leading, intermediate, or trailing secondary data point. If found to be a leading or intermediate secondary data point, the process moves on to the next secondary data point at Step 162 and data is recorded in accordance with Step 150. If found to be a trailing secondary data point, a determination is then made at Step 164 as to whether all required principal data points have been measured.

With regard to the trailing, or last, secondary point, at Step 160, the phase of a single, pre-determined radio frequency signal is recorded for the last "secondary" data point (i.e. those secondary data points just prior to the next "principal" data points).

If, at Step 164, it is determined whether the last principal data point has been measured, and if not, the process moves on to the next principal data point at Step 166 and data is recorded in accordance with Step 140. If it is determined that the last principal data point has been measured, the process moves on to Step 170.

Steps 140–166 are repeated for each successive principal data point and all corresponding secondary data points. In this manner, phase and amplitude are measured and recorded at the same, pre-determined radio frequency and beam position of interest (for AUTs with electronically-steered beams) for each "principal" data point, and are likewise measured and recorded at pre-determined radio frequency and beam positions at the secondary data points. The radio frequency and beam positions may differ between each series or set of secondary data points, and yet is constant within a series or set. Thus, in contrast to the standard near-field testing protocol of collecting data only at a series of discrete principal data points (i.e. no data is recorded between those discrete points), data is herein collected regularly at each principal data point, and then at each corresponding series of secondary data points, as the probe moves across its measurement field/data plane or virtual surface.

At Step 170, the collected data is separated into two subsets associated with "principal" and "secondary" data points.

At Step 180, the subset of "principal" data point information is analyzed to determine the AUT 40 far-field pattern, or to identify malfunctioning AUT 40 elements. The analysis consists of the use of a computer 60 to perform a near-field to far-field or a near-field to aperture transform of the "principal" data. The transformed data represents an AUT 40 far-field pattern or aperture phase and amplitude (which is used to identify malfunctioning elements).

At Step 190, the subset of "secondary" data point information is analyzed to identify and/or quantify any relative vibration between the AUT 40 and the probe 30. The analysis consists of the use of a computer 60 to perform a Fourier transform of the time varying phase to the frequency domain of the "secondary" data. Any relative movement between the probe 30 and the AUT 40 causes the phase to change. Relative vibration between the probe 30 and the AUT 40 causes the phase to vary with a frequency equal to that of the relative vibration. The transform causes the vibration frequency to show up as spikes. The transformed data represents an identification and/or quantification of the amount of relative vibration that existed between the AUT 40 and the probe 30 during the data collection process. FIGS. 3–6 are a series of four graphs illustrating how a phase change along each series of secondary data points is translated to determine vibration.

Figure 3:
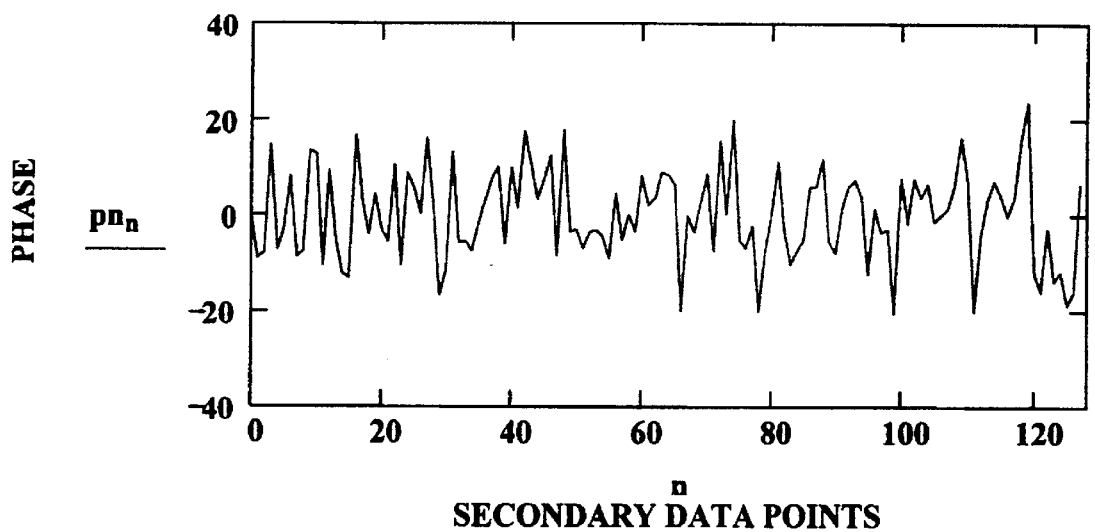
FIGS. 3–6 are a series of four graphs illustrating how a phase change along each series of secondary data points is translated to determine vibration.

FIG. 3 illustrates phase measurements at 128 secondary data points when there is no vibration (just phase noise).

Figure 4:
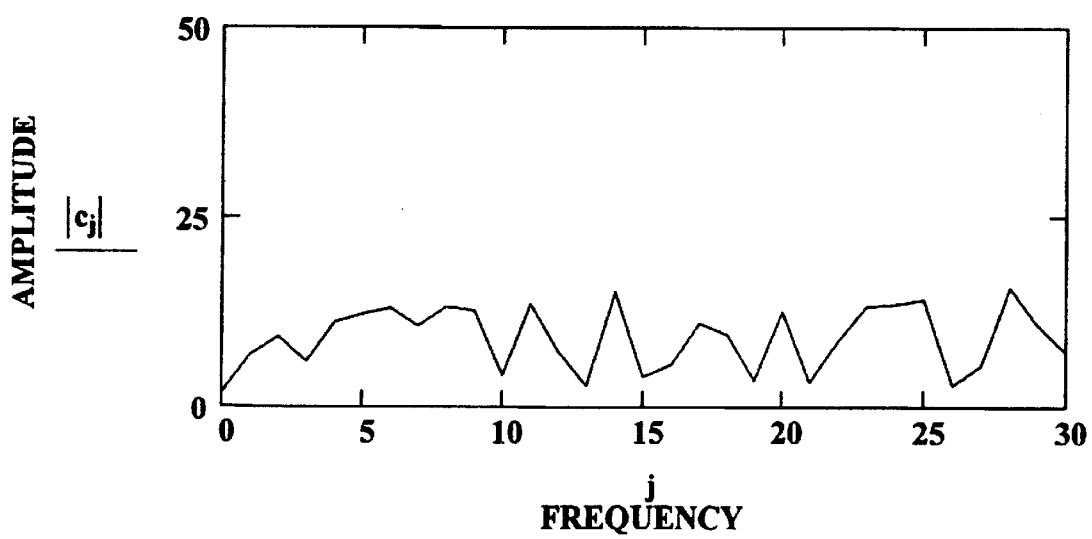

FIG. 4 illustrates the relatively flat frequency spectrum for the data shown in FIG. 3.

Figure 5:
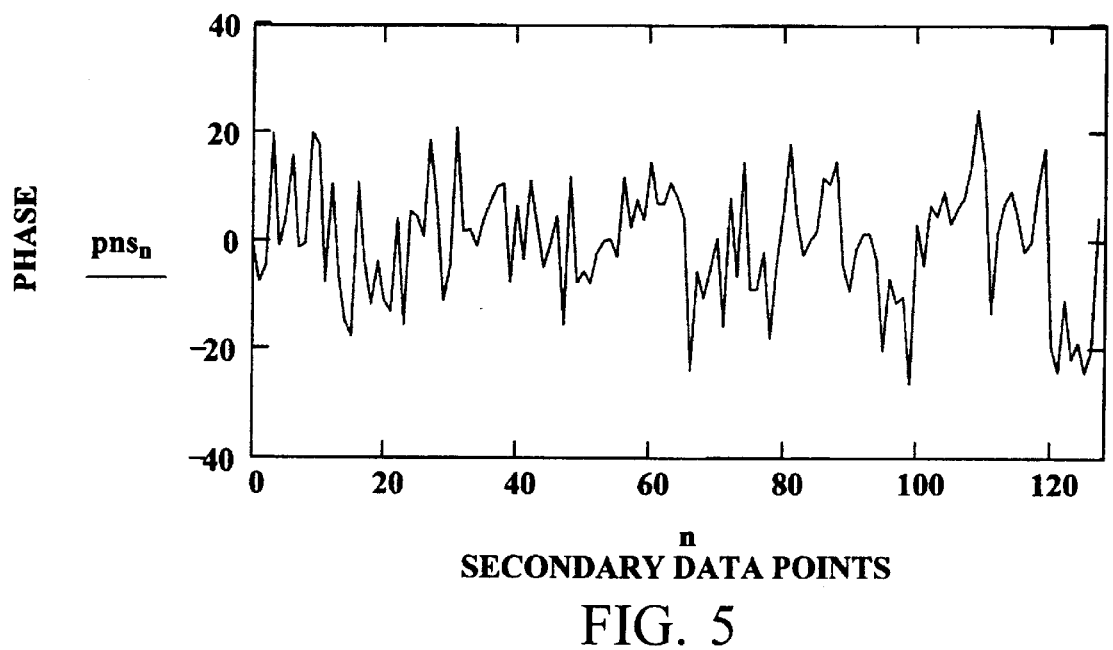

FIG. 5 illustrates a series of phase measurements at 128 secondary data points with a 5 hertz vibration frequency added.

Figure 6:
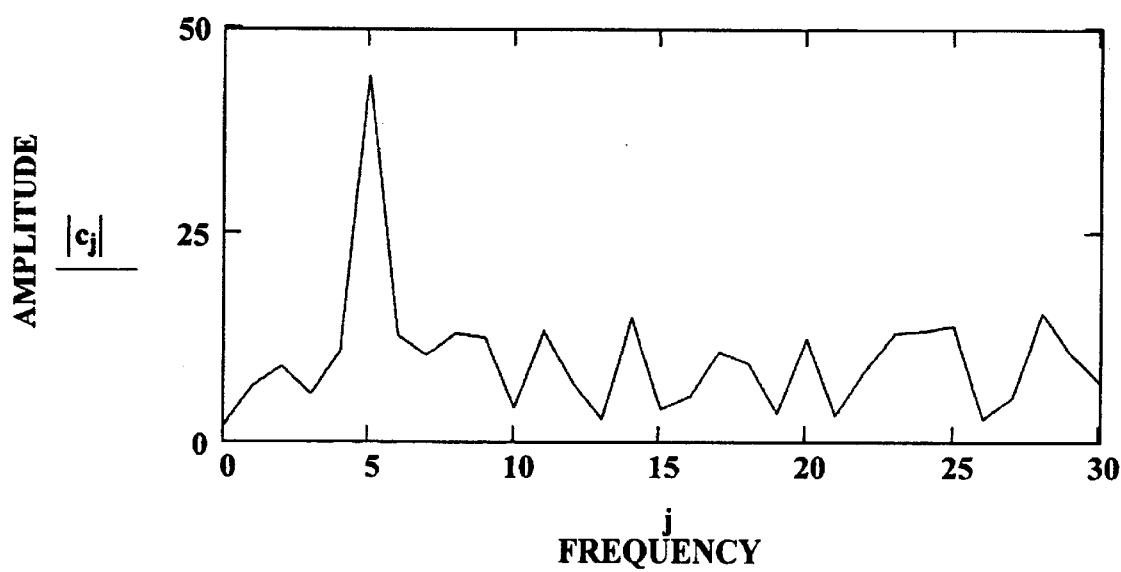

FIG. 6 illustrates the frequency spectrum for the data shown in FIG. 5. A spike is clearly visible at 5 hertz, indicating vibration.

The computer 60 may notify the operator of excessive vibration based on a pre-established criteria. Even in instances where absolutely no relative vibration exists, there will be some phase variation due to the AUT 40 itself. However, this phenomenon normally occurs at a frequency that is much slower than that for the vibrations that generate data inaccuracies/errors. The Fourier transform of the phase data isolates this slowly varying phenomenon. Additionally, the transform isolates phase noise.

At Step 200, the relative vibration analysis of Step 190 is used to remove the effect of relative vibration by adjusting the phase data of principle data points (consolidated at step 170). Phase data is adjusted to values that would have been used if there were no relative vibration.

The above described series of steps provides the means to measure and compensate for any data inaccuracies/errors created by relative vibration between the AUT 40 and the probe 30. The process may be performed without the need for any additional hardware other than that normally utilized in conducting a near-field test.

For AUTs with electronically-steered beams, pointing the AUT 40 beam along an axis that is normal to the face of the AUT 40 (i.e. the data point test plane) detects vibrations along that axis. By pointing, or steering, the beam at some angle from that normal axis, for example, 45° in azimuth, vibrations along axes perpendicular to the normal axis can be detected. Vibrations along any axis of motion can be detected by using three different beams (e.g. a normal beam, a beam angled 45° in azimuth, a beam angled 45° in elevation). This is because vibration in any arbitrary direction must possess some component of motion along at least one of the three beams and, therefore, some amount of phase variation in at least one of the three beams.

The implementation of the method of the present invention results in the detection of relative vibration between the RF probe 30 and the AUT 40. It is a method that is superior to others involving additional hardware. Vibration sensors attached to the probe 30 and/or the AUT 40 may easily fail to detect the full amount of vibration. For example, a vibration sensor attached to only a single point on the AUT 40 may not provide an accurate measure of the vibration that is occurring in the AUT 40 directly opposite the probe 30 (this is especially true for large antennas).

The method of the present invention eliminates a source of test error and increases the confidence that an accurate near-field test has been conducted. The vibration information provided by this method may be used to actively compensate (in analysis or hardware) for any principle data point position inaccuracy/error caused by the vibration.

Having now fully set forth the preferred embodiment and certain modifications of the concept underlying the present invention, various other embodiments as well as certain variations and modifications of the embodiments herein shown and described will obviously occur to those skilled in the art upon becoming familiar with said underlying concept. It is to be understood, therefore, that the invention may be practiced otherwise than as specifically set forth in the appended claims.

We claim:

1. A method for detecting relative vibration between a probe and an antenna under test (AUT) during near-field testing comprising the steps of:

moving said probe at a constant velocity across a measurement field for said AUT;

sampling data regularly during the movement of said probe, said data including a first subset of principle data points and a second subset of secondary data points;

analyzing said first subset of principal data points to obtain preliminary performance characteristics for said AUT;

analyzing said second subset of secondary data points to identify and quantify any relative vibration between said probe and said AUT; and adjusting said preliminary performance characteristics to obtain actual performance characteristics for said AUT.

2. The method for detecting relative vibration between a probe and an AUT during near-field testing according to claim 1, wherein said measurement field is located two to five radio frequency (RF) wavelengths in front of said AUT.

3. The method for detecting relative vibration between a probe and an AUT during near-field testing according to claim 1, wherein said step of sampling data regularly further comprises sampling said second subset of secondary data points at a sampling rate determined with regard to a highest and a lowest vibration frequency of concern.

4. The method for detecting relative vibration between a probe and an AUT during near-field testing according to claim 3, wherein said step of sampling data regularly further comprises sampling said second subset of secondary data points at a minimum of twice said highest vibration frequency of concern.

5. The method for detecting relative vibration between a probe and an AUT during near-field testing according to claim 1, wherein said step of sampling data regularly further comprises sampling said second subset of secondary data points over at least one time period of said lowest frequency of concern.

6. The method for detecting relative vibration between a probe and an AUT during near-field testing according to claim 1, wherein said step of sampling data regularly further comprises sampling said second subset of secondary data points by measuring phase for a constant frequency and beam position at each secondary data point.

7. The method for detecting relative vibration between a probe and an AUT during near-field testing according to claim 1, wherein said step of analyzing said second subset of secondary data points further comprises performing a Fourier transform of the time varying phase to the frequency domain to quantify the vibration frequency.

8. The method of detecting relative vibration between a probe and an AUT during near-field testing according to claim 1, wherein said second subset of secondary data points are defined independently from said first subset of principle data points.

9. The method for detecting relative vibration between a probe and an AUT during near-field testing according to claim 1, wherein said second subset of secondary data points are defined dependently to said first subset of principle data points.

10. The method for detecting relative vibration between a probe and an AUT during near-field testing according to claim 9, wherein said step of sampling comprises sampling secondary data points between two adjoining principle data points.

11. The method for detecting relative vibration between a probe and an AUT during near-field testing according to claim 9, wherein said step of sampling comprises sampling secondary data points around adjoining principle data points.

12. The method for detecting relative vibration between a probe and an AUT during near-field testing according to claim 1, wherein said principle data points are discrete data points no farther apart than one-half the length of a RF signal's wavelength.

13. A method for detecting relative vibration between a probe and an antenna under test (AUT) during near-field testing comprising the steps of:

moving said probe at a constant velocity across a measurement field for said AUT;

sampling a plurality of secondary data points regularly during the movement of said probe by measuring phase for a constant frequency and beam position at each secondary data point; and, analyzing said secondary data points to identify and quantify relative vibration between said probe and said AUT.

14. The method for detecting relative vibration between a probe and an AUT during near-field testing according to claim 12, wherein said data points are oriented in a pattern represented by a plane, a surface of a virtual cylinder or a sphere that encloses said AUT.

15. The method for detecting relative vibration between a probe and an AUT during near-field testing according to claim 1, further comprising the step of adjusting preliminary performance characteristics of said AUT with said quantified relative vibration to obtain actual performance characteristics for said AUT.

16. The method for detecting relative vibration between a probe and an AUT during near-field testing according to claim 15, wherein said preliminary performance characteristics based on said principle data points are determined by means of a Fourier transform.

17. The method for detecting relative vibration between a probe and an AUT during near-field testing according to claim 15, wherein said step of analyzing said secondary data points is by means of a Fourier transform.

18. The method for detecting relative vibration between a probe and an AUT during near-field testing according to claim 17, wherein said Fourier transform is a transform of the time varying phase to the frequency domain.

* * * * *